(12) United States Patent
Sayed-Hasan

(10) Patent No.: US 12,292,477 B2
(45) Date of Patent: May 6, 2025

(54) SYSTEMS, DEVICES, AND METHODS FOR MONITORING INSULATION CONDITIONS OF HIGH-VOLTAGE MOTORS

(71) Applicant: SAUDI ARABIAN OIL COMPANY, Dhahran (SA)

(72) Inventor: Younes T. Sayed-Hasan, Al-Hasa (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 208 days.

(21) Appl. No.: 18/066,912

(22) Filed: Dec. 15, 2022

(65) Prior Publication Data

US 2024/0201263 A1   Jun. 20, 2024

(51) Int. Cl.
| | |
|---|---|
| *H02M 1/084* | (2006.01) |
| *G01R 31/34* | (2020.01) |
| *H02K 5/22* | (2006.01) |
| *H02K 11/20* | (2016.01) |
| *G01R 27/02* | (2006.01) |

(52) U.S. Cl.
CPC ........... *G01R 31/343* (2013.01); *H02K 5/225* (2013.01); *H02K 11/20* (2016.01); *G01R 27/025* (2013.01)

(58) Field of Classification Search
CPC .... G01R 31/343; G01R 27/025; H02K 5/225; H02K 11/20
See application file for complete search history.

(56) References Cited

U.S. PATENT DOCUMENTS

| | | | |
|---|---|---|---|
| 2009/0040034 A1 | 2/2009 | Drew et al. | |
| 2018/0091083 A1* | 3/2018 | Satou | G01R 31/346 |
| 2019/0250204 A1* | 8/2019 | Geiss | G01R 31/1272 |
| 2020/0240288 A1* | 7/2020 | Rasheed | F01D 21/16 |
| 2020/0300916 A1* | 9/2020 | Aziz | G01R 31/50 |
| 2022/0393568 A1* | 12/2022 | Nishibata | H02K 11/33 |

FOREIGN PATENT DOCUMENTS

| | | |
|---|---|---|
| DE | 102008022908 A1 | 12/2009 |
| EP | 2923430 A1 | 9/2015 |

* cited by examiner

*Primary Examiner* — Muhammad S Islam
(74) *Attorney, Agent, or Firm* — Vorys, Sater, Seymour and Pease LLP

(57) ABSTRACT

In some examples, a system includes a high-voltage motor coupled to multiple motor leads housed within a terminal box, a power supply coupled to the multiple motor leads, and a voltage injection device coupled to the power supply and the multiple motor leads, the voltage injection device configured to couple to a data acquisition system.

12 Claims, 3 Drawing Sheets

SYSTEMS, DEVICES, AND METHODS FOR MONITORING INSULATION CONDITIONS OF HIGH-VOLTAGE MOTORS

FIELD OF THE DISCLOSURE

The present description relates generally to monitoring insulation conditions of high-voltage motors and, more particularly, to systems, devices and methods for measuring an insulation resistance, a polarization index, a step voltage, or a combination thereof, of high-voltage motors to monitor a condition of the insulation.

BACKGROUND OF THE DISCLOSURE

High-voltage motors are used in a variety of industrial applications. A high-voltage motor may power a mechanical or an electromechanical system within a plant or manufacturing facility for instance. Common failures of high-voltage motors involve insulation of the high-voltage motors. The insulation failure may involve, phase-to-phase insulation, phase-to-ground insulation, or a combination thereof. Monitoring insulation conditions of high-voltage motors can include powering down the motor, isolating the motor from a power source of the motor, complying with safety standards of an organization owning or operating the high-voltage motor, erecting scaffolding to perform testing depending on location of components of the motor, and removing a cover of a terminal box of the motor to disconnect terminal leads of the motor. Monitoring the insulation conditions uses man hours that increase a downtime of the motor and the system that includes the motor, poses a safety risk to one or more persons performing the monitoring, and potentially exposes internal components of the motor to debris, moisture, or a combination thereof. Manual record keeping associated with the monitoring may also result in lost records and uncertainty regarding when to perform the monitoring.

SUMMARY OF THE DISCLOSURE

Various details of the present disclosure are hereinafter summarized to provide a basic understanding. This summary is not an extensive overview of the disclosure and is neither intended to identify certain elements of the disclosure, nor to delineate the scope thereof. Rather, the purpose of this summary is to present some concepts of the disclosure in a simplified form prior to the more detailed description that is presented hereinafter.

According to an embodiment of the present disclosure, a system includes a high-voltage motor coupled to multiple motor leads housed within a terminal box, a power supply coupled to the multiple motor leads, and a voltage injection device coupled to the power supply and the multiple motor leads, the voltage injection device configured to couple to a data acquisition system.

In another embodiment of the present disclosure, a method includes receiving a request to monitor one or more insulation conditions of a high-voltage motor, determining one or more measurements of one or more insulations of a high-voltage motor, and transmitting the one or more measurements for storage or display.

Any combinations of the various embodiments and implementations described herein can be used in a further embodiment, consistent with the disclosure. These and other aspects and features can be appreciated from the following description of certain embodiments presented herein in accordance with the disclosure and the accompanying drawings and claims.

DETAILED DESCRIPTION

Figure 1:
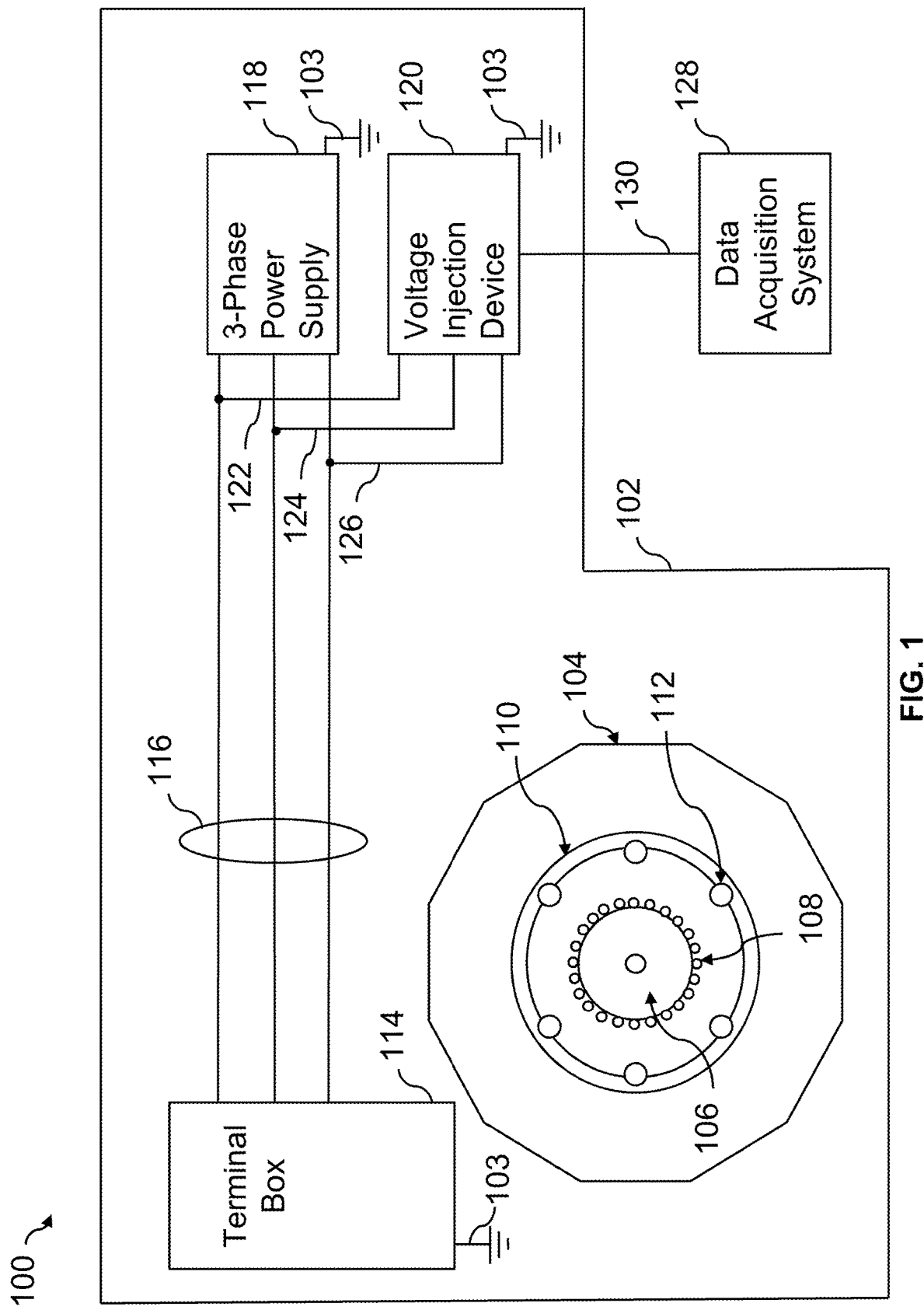
FIG. 1 is a block diagram of a system for monitoring insulation conditions of high-voltage motors, in accordance with certain embodiments.

Embodiments of the present disclosure will now be described in detail with reference to the accompanying Figures. Like elements in the various figures may be denoted by like reference numerals for consistency. Further, in the following detailed description of embodiments of the present disclosure, numerous specific details are set forth in order to provide a more thorough understanding of the claimed subject matter. However, it will be apparent to one of ordinary skill in the art that the embodiments described herein may be practiced without these specific details. In other instances, well-known features have not been described in detail to avoid unnecessarily complicating the description. Additionally, it will be apparent to one of ordinary skill in the art that the scale of the elements presented in the accompanying Figures may vary without departing from the scope of the present disclosure.

Embodiments in accordance with the present disclosure generally relate to systems and methods for monitoring one or more insulation conditions of high-voltage motors and, more particularly, to systems and methods for measuring an insulation resistance, a polarization index, a step voltage, or a combination thereof, of high-voltage motors. In non-limiting examples, a system includes a high-voltage motor having multiple motor leads housed within a terminal box. The multiple motor leads couple to a power supply and a voltage injection device. The voltage injection device is configured to couple to a data acquisition system (DAS). In response to a request to monitor one or more insulation conditions of the high-voltage motor, the system performs one or more measurements of one or more insulation conditions of the high-voltage motor. The system transmits the one or more measurements for storage or display. Using the system for monitoring the one or more insulation conditions of the high-voltage motor reduces a number of hours of downtime for the system including the high-voltage motor and the safety risk to persons performing the monitoring, prevents exposure of internal components of the high-voltage motor to debris, moisture, or a combination thereof. Additionally, using the system for monitoring the one or more insulation conditions of the high-voltage motor reduces uncertainty and error associated with manual record keeping.

FIG. 1 is a block diagram of a system 100 for monitoring insulation conditions of high-voltage motors, in accordance with certain embodiments. The system 100 monitors insulation conditions for a mechanical or electromechanical system, for example. The mechanical or electromechanical system is the system 102, for example. Within the system 102, in a non-limiting example, a high-voltage motor 104 includes a rotor 106, multiple rotor bars 108, a stator 110, and multiple stator windings 112. Multiple motor leads (not shown) couple to the high-voltage motor 104. The multiple motor leads are housed within a terminal box 114. A ground lead of the multiple motor leads is configured to couple to a ground 103 of the system 102. The multiple motor leads couple to a power supply 118 and a voltage injection device 120 by way of connections 116. In a non-limiting example, the voltage injection device 120 is configured to monitor one or more insulation conditions of the high-voltage motor 104. To monitor the one or more insulation conditions of the high-voltage motor 104, the voltage injection device 120 is configured to supply one or more voltage signals to the high-voltage motor 104 and to measure at least one of an insulation resistance, a polarization index, a step voltage, or a combination thereof, for example. In a non-limiting example, the voltage injection device 120 and the DAS 128 are housed within a secure location. The secure location may require a specified access level, a key, or a combination thereof, to enter, for example. For example, the secure location may be a switchgear cubicle (not shown).

The power supply 118 is a three-phase power supply in a non-limiting example and includes a different lead for each phase of the three phases, as well as a lead that is configured to couple to the ground 103. The voltage injection device 120 includes multiple leads, where a different lead of the multiple leads couples to a lead associated with a different phase of the power supply 118. A ground lead of the multiple leads of the voltage injection device 120 is configured to couple to the ground 103. For example, a first lead of the voltage injection device 120 couples to a first phase of the power supply 118 and a first lead of the multiple leads of the high-voltage motor 104 via a connection 122. A second lead of the voltage injection device 120 couples to a second phase of the power supply 118 and a second lead of the multiple leads of the high-voltage motor 104 via a connection 124. A third lead of the voltage injection device 120 couples to a third phase of the power supply 118 and a third lead of the multiple leads of the high-voltage motor 104 via a connection 126. The closed connections 122, 124, 126 between the voltage injection device 120, the power supply 118, and the multiple leads of the high-voltage motor 104 prevent current from flowing to the voltage injection device 120 during normal operations of the system 102.

In a non-limiting example, the voltage injection device 120 is configured to receive a signal that indicates whether to perform an insulation resistance test, a polarization index test, a step voltage test, or a combination thereof. In response to the signal, the voltage injection device 120 supplies one or more voltage signals to the high-voltage motor 104. The voltage injection device 120 monitors the connections 116 to determine one or more measurements. For example, the voltage injection device 120 monitors the connections 116 to determine one or more currents flowing between one or more of a first phase and a second phase (e.g., A-B), a second phase and a third phase (e.g., B-C), the first phase and the third phase (e.g., A-C), the first phase and the ground 103 (e.g., A-G), the second phase and the ground 103 (e.g., B-G), or the third phase and the ground 103 (e.g., C-G). In a non-limiting example, the voltage injection device 120 transmits the one or more measurements to a data acquisition system 128 (e.g., the DAS 128). In another non-limiting example, the voltage injection device 120 determines one or more resistances using the one or more currents and transmits the one or more resistances to the DAS 128. In another non-limiting example, based on the one or more measurements, the one or more resistances, or a combination thereof, the voltage injection device 120 determines a state of the phase-to-phase insulation, a state of the phase-to-ground insulation, or a combination thereof, where the state indicates a condition (e.g., good/bad, pass/fail) of the insulation and transmits the states to the DAS 128.

In some examples, in response to the signal that indicates whether to perform an insulation resistance test, a polarization index test, a step voltage test, or a combination thereof, the voltage injection device 120 determines whether the high-voltage motor 104 is powered down prior to performing the testing. For example, the voltage injection device 120 monitors an output voltage of the high-voltage motor 104 to determine whether the high-voltage motor 104 is powered down. In response to a determination that the high-voltage motor 104 is powered down, the voltage injection device 120 proceeds with the testing.

In a non-limiting example, in response to a signal indicating to perform the insulation resistance test, the voltage injection device 120 supplies a specified voltage, where the specified voltage is determined based on a rating of the high-voltage motor 104. The specified voltage is between 1 kilovolt (kV) to 5 kB, for example. In another example, the specified voltage is determined by a manufacture, owner, or operator associated with the high-voltage motor 104. In a non-limiting example, the voltage injection device 120 is to supply the specified voltage for a specified time period. The specified time period is 10 minutes, for example. In another example, the specified time period is determined by the manufacture, owner, or operator associated with the high-voltage motor 104. At the end of the specified time period, the voltage injection device 120 monitors the connections 116 to determine one or more measurements.

In another non-limiting example, in response to a signal indicating to perform the polarization index test, the voltage injection device 120 supplies the specified voltage for a specified time period. The voltage injection device 120 monitors the connections 116 to determine one or more measurements at a first time within the specified time period and at a second time within the specified time period. For example, the voltage injection device 120 determines a first set of measurements at 1 minute and a second set of measurements at 10 minutes.

In another non-limiting example, in response to a signal indicating to perform the step voltage test, the voltage injection device 120 supplies different specified voltages for subsequent specified time periods. For example, the voltage injection device 120 is configured to supply a first specified voltage for a first specified time period, a second specified voltage for a second specified time period, and a third specified voltage for a third specified time period. The different specified voltages may include values between, and to include, 1 kB to 5 kB in 0.5 kB increments, and the subsequent specified time periods may each equal a minute, for example. In other non-limiting examples, the subsequent specified time periods may be of different durations. For example, the subsequent specified time periods may increase or decrease from a previous specified time period. In some examples, the subsequent specified time periods may depend on a specified voltage associated a specified time period. For example, a higher specified voltage may be associated with a short specified time period. At the end of each of the specified time periods, the voltage injection device 120 monitors the connections 116 to determine one or more measurements.

In a non-limiting example, the DAS 128 is configured to monitor insulation conditions of the high-voltage motor 104.

In a non-limiting example, the DAS 128 is a computer system, as described below with respect to FIG. 3. In a non-limiting example, the DAS 128 communicates with the system 102 via a connection 130. The connection 130 may be a wired or wireless connection, as described below with respect to FIG. 3. The DAS 128 may be a local system, located with a same facility as the system 102, or a remote system hosted, completely or in part, in the cloud, for example. The DAS 128 may be communicatively coupled to multiple systems to monitor multiple high-voltage motors.

In various non-limiting examples, a request to monitor one or more insulation conditions for the high-voltage motor 104 is received by the DAS 128 from an input device or via a network interface, as described below with respect to FIG. 3. The DAS 128 transmits a signal to the voltage injection device 120 to perform the measurements to monitor the one or more insulation conditions. The DAS 128 receives the results of the monitoring (e.g., one or more measurements, one or more determinations, one or more states) and records or displays the results. In a non-limiting example, the DAS 128 stores the results to a computer-readable media, such as a database, which stores a record of the measurements received by the DAS 128 from the system 102 over a time period. In another non-limiting example, the DAS causes the results to be displayed by a display device. The display device may be local or remote to the DAS.

In some non-limiting examples, the DAS 128 receives the request to monitor the one or more insulation conditions for the high-voltage motor 104 from a user system via a network interface. The user system may be a system as described below with respect to FIG. 3, for example. In a non-limiting example, a user of the user system submits the request to monitor the one or more insulation conditions for the high-voltage motor 104 via a browser of a computer application installed to the user system. In another non-limiting example, the DAS 128 includes a web-based interface accessible by the browser of the user system.

In various non-limiting examples, the DAS 128 verifies that the user has permission to request to monitor the one or more insulation conditions for the high-voltage motor 104. In some non-limiting examples, the DAS 128 retrieves a role of the user from a security permissions database, or other database storing user access permissions, roles, or a combination thereof, to monitor whether the role indicates that the user has permission to request to monitor the one or more insulation conditions for the high-voltage motor 104. The database is a computer-readable media, such as described below with respect to FIG. 3, for example. In some non-limiting examples, in response to an indication that the user has permission to monitor the one or more insulation conditions for the high-voltage motor 104, the DAS 128 transmits the request to monitor the one or more insulation conditions for the high-voltage motor 104 to the system 102. In other non-limiting examples, in response to an indication that the user has permission to request to monitor the one or more insulation conditions for the high-voltage motor 104, the DAS 128 may determine whether the high-voltage motor 104 is powered down. The DAS 128 may determine whether the high-voltage motor 104 is powered down by querying the user, for example. In another example, the DAS 128 may determine whether the high-voltage motor 104 is powered down by monitoring whether an output signal is supplying 0V.

In a non-limiting example, the DAS 128 receives a signal indicating to monitor the one or more insulation conditions for the high-voltage motor 104. Based on the signal, the DAS 128 determines whether to perform an insulation resistance test, a polarization index test, a step voltage, test, or a combination thereof, and transmits a signal to cause the voltage injection device 120 to supply one or more voltage signals to the high-voltage motor 104.

In a non-limiting example, the DAS 128 determines a rating of the high-voltage motor 104. For example, the DAS 128 determines the rating based on a permission associated with the user. In a non-limiting example, the DAS 128 transmits a signal including the rating to the voltage injection device 120 to supply a specified voltage based on the rating.

In a non-limiting example, the DAS 128 receives one or more measurements from the voltage injection device 120 and displays one or more results of the monitoring. For example, the DAS 128 may display an indication of whether a measurement of the insulation resistance test is equivalent to or exceeds a minimum acceptable insulation resistance, where the minimum acceptable insulation resistance is determined by:

$$RM = 1\ M\Omega * \text{motor rating} + 1\ M\Omega,$$

where RM is a minimum insulation resistance in megaOhms (MΩ) at 40° C. and motor rating is a rating of the high-voltage motor 104 in kilovolts (kV).

In another example, the DAS 128 may display an indication of whether a measurement of the polarization index (PI) is equivalent to or exceeds a minimum acceptable polarization index, where PI is determined by:

$$PI = \text{resistance at first time period}/\text{resistance at second time period},$$

where the resistance at the first time period is a resistance measured at a ten-minute point of the test and the resistance at the second time period is a resistance measured at a one-minute point of the test.

In a non-limiting example, in response to the PI, the DAS 128 may use an indicator to display a pass or a fail indication. For example, in response to the PI exceeding a specified threshold, the DAS 128 may display a green indicator or the word "PASS." The specified threshold may be 2.0, for example. In another example, the specified threshold may be determined by the manufacturer, owner, or operator of the system 100. In another non-limiting example, in response to the PI, the DAS 128 may use an indicator to display a rating. For example, in response to a PI that is equivalent to a first specified threshold, the DAS 128 may display the word "BAD," in response to the PI that is between a second specified threshold and the first specified threshold, the DAS 128 may display the word "WARNING," and in response to the PI exceeding the second specified threshold, the DAS 128 may display the word "GOOD." The DAS 128 may display a graph including the at least one of the insulation resistance, the polarization index, the step voltage, or the combination thereof, in a non-limiting example. The graph may include a previous insulation resistance, a previous polarization index, a previous step voltage, or a combination thereof, for comparison.

In another non-limiting example, the DAS 128 receives the response signal and determines at least one of a, a phase-to-phase insulation, a phase-to-ground insulation, or a combination thereof. The DAS 128 may display a graph including a condition of the, the phase-to-phase insulation, the phase-to-ground insulation, or the combination thereof, based on the determination. The graph may include a previous, a previous phase-to-phase insulation, a previous phase-to-ground insulation, or a combination thereof.

Figure 2:
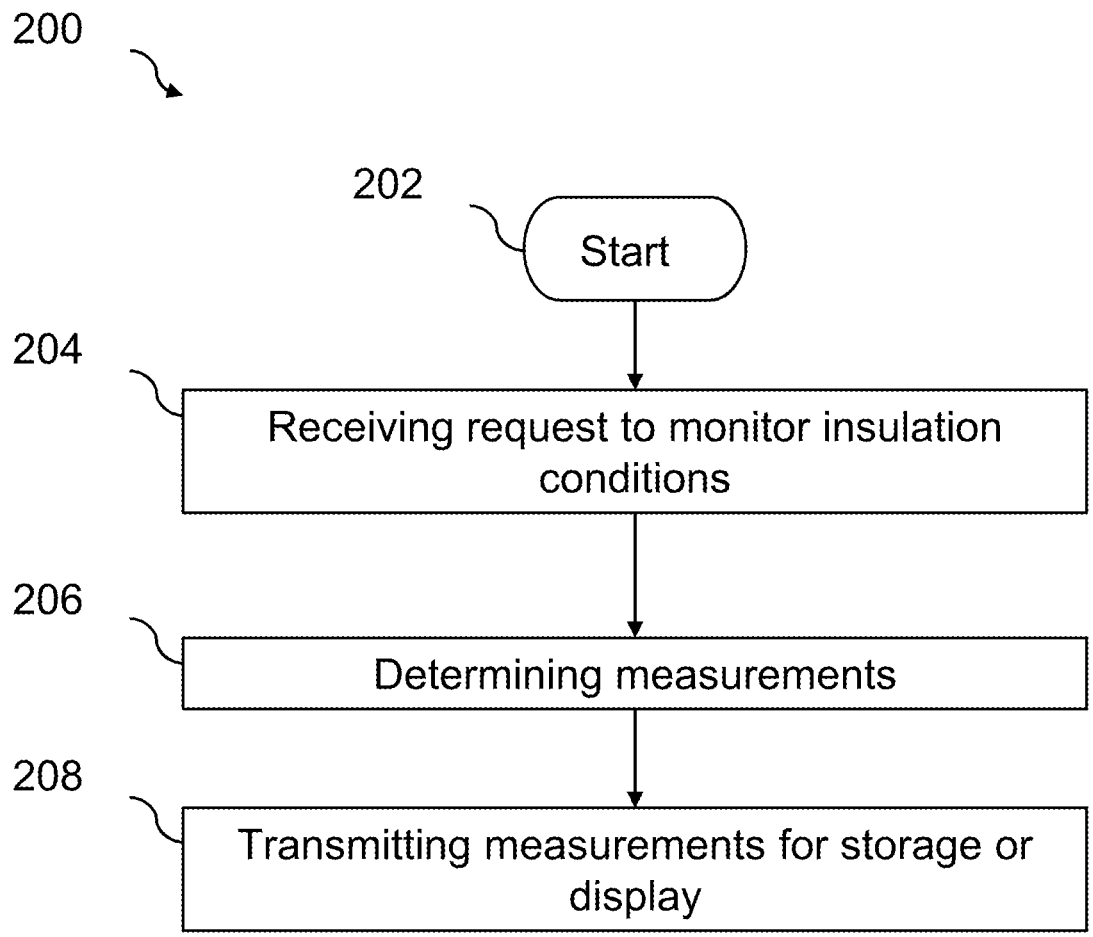
FIG. 2 is a flow diagram of a method for monitoring insulation conditions of high-voltage motors, in accordance with certain embodiments.

FIG. 2 is a flow diagram of a method 200 for monitoring the one or more insulation conditions of high-voltage motors. In a non-limiting example, the method 200 is used by a mechanical or electromechanical system including a high-voltage motor. The method 200 is used by the voltage injection device 120 of the system 102 to monitor one or more insulation conditions of the high-voltage motor 104, as described with respect to FIG. 1, for example. The method 200 includes starting (block 202), receiving a request to monitor the one or more insulation conditions (block 204), determining the measurements (block 206), and transmitting the measurements for storage or display (208).

Starting block 202 includes, but is not limited to, receiving the request from a user, the present system, another system, or a combination thereof, that indicates the present system is to perform the method 200. Receiving the request at block 204 includes, but is not limited to receiving a signal received from one or more input devices, network interfaces, or a combination thereof, associated with the present system, another system, or a combination thereof, for example. For example, receiving the request at block 204 includes the voltage injection device receiving a signal from a DAS (e.g., the DAS 128 of FIG. 1).

In a non-limiting example, in response to receiving the request to monitor the one or more insulation conditions of the high-voltage motor at block 204, the method 200 includes monitoring whether the high-voltage motor is powered down. The method 200 includes determining whether the high-voltage motor is powered down using techniques described above with respect to FIG. 1, for example. The method 200 may also include generating an indicator that indicates a result of the determination. In non-limiting examples, the method 200 includes generating an indicator based on whether the high-voltage motor is powered down. The method 200 may also include transmitting the indicator for display to a user.

In a non-limiting example, determining the measurements at block 206 includes supplying one or more voltage signals to the multiple leads of the high-voltage motor. The method 200 may also include monitoring multiple connections to determine one or more measurements using the techniques described herein with respect to FIG. 1. Additionally, the method 200 may include determining one or more resistances using the one or more measurements, as described herein with respect to FIG. 1. The method 200 may also include determining one or more states based on the one or more measurements, the one or more resistances, or a combination thereof, using the techniques described herein with respect to FIG. 1.

In a non-limiting example, transmitting the measurements at block 208 includes transmitting at least one of the one or more measurements, the one or more resistances, the one or more states, or a combination thereof, for storage or display. For example, the voltage injection device may transmit the measurements to the DAS for storage or display. The DAS may store the measurements to a computer-readable media, such as a database, which stores a record of the measurements over a time period. In another non-limiting example, the DAS also displays the measurements to a display device that may be a local or a remote display device to a system performing the method 200. In a non-limiting example, the method 200 includes generating a notification in response to a determination that the one or more insulation conditions of the high-voltage motor are due for monitoring. For example, the method 200 may include monitoring a timer. In response to a specified amount of time elapsing, the method 200 includes generating the notification.

The blocks of the method 200 may be executed by one or multiple computer applications. The blocks of the method 200 may be executed in any order, and in any combination logically enabled, such as where logic dictates that an input of a block is dependent upon an output of another block, and may individually be executed one or more times. As a non-limiting example, block 210 may be executed one (1) time, block 204 may be executed six (6) times followed by three (3) executions of block 206, followed by executions of block 208 one (1) time and block 210 two (2) times.

System 100 may be partially or wholly implemented, in any combination, as part of one or more systems used by one or more organizations for monitoring the one or more insulation conditions of high-voltage motors of the one or more organizations. While the examples described herein refer to a single organization, one skilled in the art will recognize that the systems and methods described herein may provide services to multiple organizations. In a non-limiting example, multiple user systems from multiple organizations may transmit requests to monitor the one or more insulation conditions of high-voltage motors. The systems may include multiple databases, one or more for each organization of the multiple organizations. Processing a request to monitor the one or more insulation conditions of high-voltage motors may include identifying an organization associated with the request. The system may use the organization identifier to monitor a relevant database to use in processing the request, a high-voltage motor to interface with to perform the measurements, or a combination thereof.

In view of the foregoing structural and functional description, those skilled in the art will appreciate that portions of the embodiments may be embodied as a method, data processing system, or computer program product. Accordingly, these portions of the present embodiments may take the form of an entirely hardware embodiment, an entirely software embodiment, or an embodiment combining software and hardware, such as shown and described with respect to the computer system of FIG. 3. Furthermore, portions of the embodiments may be a computer program product on a computer-usable storage medium having computer readable program code on the medium. Any non-transitory, tangible storage media possessing structure may be utilized including, but not limited to, static and dynamic storage devices, hard disks, optical storage devices, and magnetic storage devices, but excludes any medium that is not eligible for patent protection under 35 U.S.C. § 101 (such as a propagating electrical or electromagnetic signal per se). As an example and not by way of limitation, a computer-readable storage media may include a semiconductor-based circuit or device or other IC (such as, for example, a field-programmable gate array (FPGA) or an ASIC), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. A computer-readable non-transitory storage medium may be volatile, nonvolatile, or a combination of volatile and non-volatile, where appropriate.

Certain embodiments have also been described herein with reference to block illustrations of methods, systems, and computer program products. It will be understood that blocks of the illustrations, and combinations of blocks in the illustrations, can be implemented by computer-executable instructions. These computer-executable instructions may be provided to one or more processor of a general purpose computer, special purpose computer, or other programmable data processing apparatus (or a combination of devices and circuits) to produce a machine, such that the instructions, which execute via the processor, implement the functions specified in the block or blocks.

These computer-executable instructions may also be stored in computer-readable memory that can direct a computer or other programmable data processing apparatus to function in a particular manner, such that the instructions stored in the computer-readable memory result in an article of manufacture including instructions which implement the function specified in the flowchart block or blocks. The computer program instructions may also be loaded onto a computer or other programmable data processing apparatus to cause a series of operational blocks to be performed on the computer or other programmable apparatus to produce a computer implemented process such that the instructions which execute on the computer or other programmable apparatus provide blocks for implementing the functions specified in the flowchart block or blocks.

Figure 3:
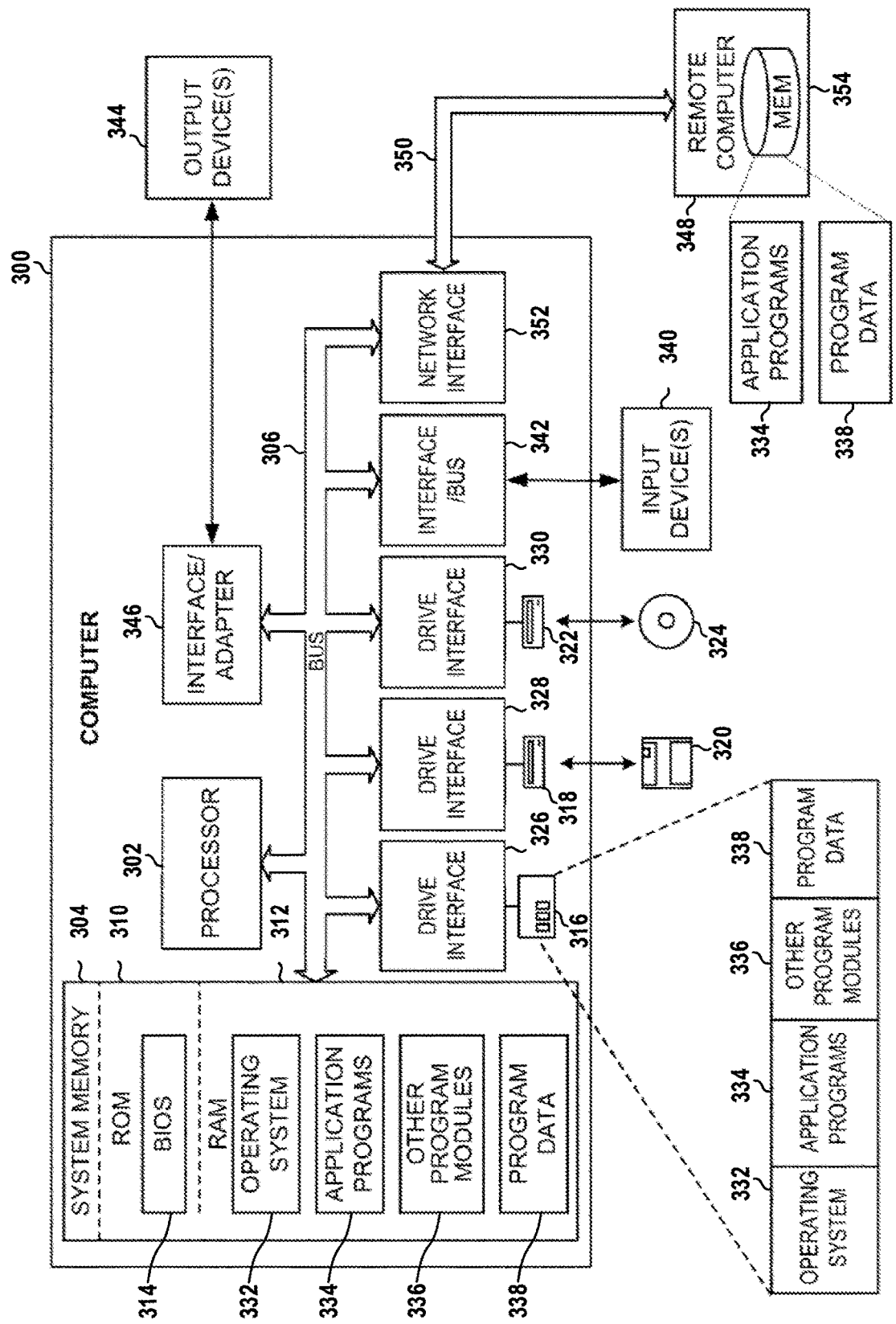
FIG. 3 is a block diagram of a computer system that can be employed to execute a system for monitoring insulation conditions of high-voltage motors, in accordance with certain embodiments.

FIG. 3 is a block diagram of a computer system that can be employed to execute a system for analyzing ransomware threat intelligence in accordance with certain embodiments described. Computer system 300 can be implemented on one or more general purpose networked computer systems, embedded computer systems, routers, switches, server devices, client devices, various intermediate devices/nodes or standalone computer systems. Additionally, computer system 300 can be implemented on various mobile clients such as, for example, a personal digital assistant (PDA), laptop computer, pager, and the like, provided it includes sufficient processing capabilities.

Computer system 300 includes processing unit 302, system memory 304, and system bus 306 that couples various system components, including the system memory 304, to processing unit 302. Dual microprocessors and other multi-processor architectures also can be used as processing unit 302. System bus 306 may be any of several types of bus structure including a memory bus or memory controller, a peripheral bus, and a local bus using any of a variety of bus architectures. System memory 304 includes read only memory (ROM) 310 and random access memory (RAM) 312. A basic input/output system (BIOS) 314 can reside in ROM 310 containing the basic routines that help to transfer information among elements within computer system 300.

Computer system 300 can include a hard disk drive 316, magnetic disk drive 318, e.g., to read from or write to removable disk 320, and an optical disk drive 322, e.g., for reading CD-ROM disk 324 or to read from or write to other optical media. Hard disk drive 316, magnetic disk drive 318, and optical disk drive 322 are connected to system bus 306 by a hard disk drive interface 326, a magnetic disk drive interface 328, and an optical drive interface 330, respectively. The drives and associated computer-readable media provide nonvolatile storage of data, data structures, and computer-executable instructions for computer system 300. Although the description of computer-readable media above refers to a hard disk, a removable magnetic disk and a CD, other types of media that are readable by a computer, such as magnetic cassettes, flash memory cards, digital video disks and the like, in a variety of forms, may also be used in the operating environment; further, any such media may contain computer-executable instructions for implementing one or more parts of embodiments shown and described herein.

A number of program modules may be stored in drives and RAM 312, including operating system 332, one or more computer application programs 334, other program modules 336, and program data 338. In some examples, the computer application programs 334 can include one or more sets of computer-executable instructions of the DAS 128, and the program data 338 can include the measurements stored to the database. The computer application programs 334 and program data 338 can include functions and methods programmed to perform the method 200 to monitor the one or more insulation conditions of high-voltage motors, such as shown and described herein.

A user may enter commands and information into computer system 300 through one or more input devices 330, such as a pointing device (e.g., a mouse, touch screen), keyboard, microphone, joystick, game pad, scanner, and the like. For instance, the user can employ input device 330 to edit or modify the DAS 128, data stored to the database including the measurements, or a combination thereof. These and other input devices 330 are often connected to processing unit 302 through a corresponding port interface 342 that is coupled to the system bus, but may be connected by other interfaces, such as a parallel port, serial port, or universal serial bus (USB). One or more output devices 344 (e.g., display, a monitor, printer, projector, or other type of displaying device) is also connected to system bus 306 via interface 346, such as a video adapter.

Computer system 300 may operate in a networked environment using logical connections to one or more remote computers, such as remote computer 348. Remote computer 348 may be a workstation, computer system, router, peer device, or other common network node, and typically includes many or all the elements described relative to computer system 300. The logical connections, schematically indicated at 350, can include a local area network (LAN) and a wide area network (WAN). When used in a LAN networking environment, computer system 300 can be connected to the local network through a network interface or adapter 352. When used in a WAN networking environment, computer system 300 can include a modem, or can be connected to a communications server on the LAN. The modem, which may be internal or external, can be connected to system bus 306 via an appropriate port interface. In a networked environment, computer application programs 334 or program data 338 depicted relative to computer system 300, or portions thereof, may be stored in a remote memory storage device 354.

The terminology used herein is for the purpose of describing particular embodiments only and is not intended to be limiting of the invention. As used herein, for example, the singular forms "a," "an," and "the" are intended to include the plural forms as well, unless the context clearly indicates otherwise. It will be further understood that the terms "contains", "containing", "includes", "including." "comprises", and/or "comprising." and variations thereof, when used in this specification, specify the presence of stated features, integers, blocks, operations, elements, and/or components, but do not preclude the presence or addition of one or more other features, integers, blocks, operations, elements, components, and/or groups thereof.

Terms of orientation are used herein merely for purposes of convention and referencing and are not to be construed as limiting. However, it is recognized these terms could be used with reference to an operator or user. Accordingly, no limitations are implied or to be inferred. In addition, the use of ordinal numbers (e.g., first, second, third, etc.) is for distinction and not counting. For example, the use of "third" does not imply there must be a corresponding "first" or "second." Also, as used herein, the terms "coupled" or "coupled to" or "connected" or "connected to" or "attached" or "attached to" may indicate establishing either a direct or indirect connection, and is not limited to either unless expressly referenced as such.

While the description has described several exemplary embodiments, it will be understood by those skilled in the art that various changes can be made, and equivalents can be substituted for elements thereof, without departing from the spirit and scope of the invention. In addition, many modifications will be appreciated by those skilled in the art to adapt a particular instrument, situation, or material to embodiments of the description without departing from the essential scope thereof. Therefore, it is intended that the invention not be limited to the particular embodiments described, or to the best mode contemplated for carrying out this invention, but that the invention will include all embodiments falling within the scope of the appended claims. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

What is claimed is:

1. A system, comprising:
    a high-voltage motor coupled to multiple motor leads housed within a terminal box;
    a power supply coupled to the multiple motor leads, wherein the power supply is a three-phase power supply and wherein the three-phase power supply comprises
        a different phase lead for each phase of the three-phase power supply, wherein the different phase lead for each phase is coupled to a different motor lead of the multiple motor leads; and
        a ground lead coupled to a ground motor lead of the multiple motor leads; and,
    a voltage injection device coupled to the power supply and the multiple motor leads, the voltage injection device configured to couple to a data acquisition system;
        wherein the voltage injection device comprises multiple injection leads, and wherein a different injection lead of the multiple injection leads is coupled to each of the different phase leads and the ground lead of the three-phase power supply.

2. The system of claim 1, wherein the voltage injection device is configured to monitor one or more insulation conditions of the high-voltage motor by determining at least one of an insulation resistance, a polarization index, a step voltage, or a combination thereof.

3. The system of claim 1, wherein the voltage injection device is configured to couple to the data acquisition system via a wired or a wireless connection.

4. The system of claim 2, wherein the voltage injection device is configured to measure one or more currents to monitor the one or more insulation conditions.

5. The system of claim 2, wherein the data acquisition system is configured to display the at least one of the insulation resistance, the polarization index, the step voltage, or the combination thereof.

6. The system of claim 2, wherein the data acquisition system is configured to store the at least one of the insulation resistance, the polarization index, the step voltage, or the combination thereof.

7. A method, comprising:
    receiving a request to monitor one or more insulation conditions of a high-voltage motor;
    supplying one or more voltage signals to multiple motor leads of the high-voltage motor, the multiple motor leads coupled to a three-phase power supply comprising a different phase lead for each phase of the three-phase power supply, wherein the different phase lead for each phase is coupled to a different motor lead of the multiple motor leads and a ground lead coupled to a ground motor lead of the multiple motor leads;
    monitoring multiple injection leads of a voltage injection device coupled to the three-phase power supply to determine one or more measurements of the high-voltage motor, wherein a different injection lead of the multiple injection leads is coupled to each of the different phase leads and the ground lead of the three-phase power supply; and
    transmitting the one or more measurements for storage or display.

8. The method of claim 7, comprising determining, in response to receiving the request to monitor the one or more insulation conditions of the high-voltage motor, whether the high-voltage motor is powered down.

9. The method of claim 7, wherein monitoring multiple injection leads comprises monitoring connections between the high-voltage motor and the voltage injection device to determine one or more currents.

10. The method of claim 7, comprising generating a notification in response to a determination that the one or more insulation conditions of the high-voltage motor are due for monitoring.

11. The method of claim 9, comprising determining one or more resistances based on the one or more current.

12. The method of claim 11, comprising determine one or more states based on the one or more resistances.

* * * * *